(12) United States Patent
Joshi et al.

(10) Patent No.: US 7,332,806 B2
(45) Date of Patent: *Feb. 19, 2008

(54) THIN, THERMALLY ENHANCED MOLDED PACKAGE WITH LEADFRAME HAVING PROTRUDING REGION

(75) Inventors: Rajeev Joshi, Cupertino, CA (US); Chung-Lin Wu, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 375 days.

This patent is subject to a terminal disclaimer.

(21) Appl. No.: 11/048,314

(22) Filed: Jan. 31, 2005

(65) Prior Publication Data

US 2005/0127483 A1   Jun. 16, 2005

Related U.S. Application Data

(63) Continuation of application No. 10/271,654, filed on Oct. 15, 2002, now Pat. No. 6,891,256.

(60) Provisional application No. 60/352,642, filed on Jan. 29, 2002, provisional application No. 60/349,260, filed on Oct. 22, 2001.

(51) Int. Cl.
*H01L 23/48* (2006.01)
*H01L 23/495* (2006.01)
*H01L 23/34* (2006.01)
*H01L 29/76* (2006.01)

(52) U.S. Cl. .............. 257/706; 257/E23.044; 257/E23.051; 257/E23.046; 257/E23.039; 257/E23.052; 257/E23.047; 257/E23.124; 257/E23.04; 257/E23.101; 257/E23.023; 257/E23.037; 257/E23.034; 257/E25.029; 257/E27.06; 257/684; 257/692; 257/666; 257/696; 257/676; 257/778; 257/690; 257/288; 257/728; 257/328; 257/687; 257/775; 257/698; 257/673; 257/315; 257/276

(58) Field of Classification Search ........ 257/E23.046, 257/E23.04, E23.124, E23.051, E23.101, 257/E23.044, E23.023, E23.092, E23.047, 257/E23.052, E25.029, E27.06, E23.014, 257/E23.037, 706, 684, 692, 666, 696, 676, 257/778, 690, 288, 728, 328, 687, 775, 698, 257/673, 315, 276
See application file for complete search history.

(56) References Cited

U.S. PATENT DOCUMENTS 5,319,242 A   6/1994   Carney et al.

(Continued)

FOREIGN PATENT DOCUMENTS

WO   WO 01/15216 A1   3/2001

OTHER PUBLICATIONS

"Package Information," Aug. 1998. pp. 1-5, Vishay Siliconix, Santa Clara, CA.

(Continued)

*Primary Examiner*—Alexander Oscar Williams
(74) *Attorney, Agent, or Firm*—Townsend and Townsend and Crew LLP (57) ABSTRACT

A semiconductor die package. It includes (a) a semiconductor die including a first surface and a second surface, (b) a source lead structure including protruding region having a major surface, the source lead structure being coupled to the first surface, (c) a gate lead structure being coupled to the first surface, and (d) a molding material around the source lead structure and the semiconductor die. The molding material exposes the second surface of the semiconductor die and the major surface of the source lead structure.

13 Claims, 9 Drawing Sheets

U.S. PATENT DOCUMENTS

| | | |
|---|---|---|
| 5,841,197 A | 11/1998 | Adamic, Jr. |
| 6,133,634 A | 10/2000 | Joshi |
| 6,143,981 A | 11/2000 | Glenn |
| 6,242,800 B1 * | 6/2001 | Munos et al. ............... 257/712 |
| 6,255,722 B1 | 7/2001 | Ewer et al. |
| 6,469,384 B2 | 10/2002 | Joshi |
| 6,476,481 B2 | 11/2002 | Woodworth et al. |
| 6,489,678 B1 | 12/2002 | Joshi |
| 6,569,764 B1 | 5/2003 | Hirashima et al. |
| 6,624,522 B2 * | 9/2003 | Standing et al. ............ 257/782 |
| 6,777,800 B2 * | 8/2004 | Madrid et al. ............. 257/690 |
| 6,812,516 B2 * | 11/2004 | Noble et al. ................ 257/315 |
| 6,943,434 B2 * | 9/2005 | Tangpuz et al. ............ 257/666 |
| 7,119,424 B2 * | 10/2006 | Ochiai et al. ............... 257/676 |
| 2002/0066950 A1 | 6/2002 | Joshi |
| 2002/0066959 A1 | 6/2002 | Joshi |
| 2002/0100962 A1 | 8/2002 | Joshi |
| 2002/0125550 A1 * | 9/2002 | Estacio ...................... 257/666 |
| 2002/0192935 A1 | 12/2002 | Joshi et al. |
| 2004/0063240 A1 * | 4/2004 | Madrid et al. .............. 438/106 |

OTHER PUBLICATIONS

"Tape and Reel Information," Aug. 1998, pp. 1-7, Vishay Siliconix, Santa Clara, CA.

* cited by examiner

THIN, THERMALLY ENHANCED MOLDED PACKAGE WITH LEADFRAME HAVING PROTRUDING REGION

CROSS-REFERENCE TO RELATED APPLICATIONS

This application is a continuation application of U.S. patent application Ser. No. 10/271,654, filed on Oct. 15, 2002, which is now U.S. Pat. No. 6,891,256, which claims the benefit of the filing date of U.S. Provisional Patent Application No. 60/349,260, filed Oct. 22, 2001, and U.S. Provisional Application No. 60/352,642, filed Jan. 29, 2002. All of the above applications are herein incorporated by reference in their entirety for all purposes.

BACKGROUND OF THE INVENTION

There are a number of semiconductor die packages. In one example of a semiconductor die package, a semiconductor die is mounted to a lead frame with leads. Wires couple the semiconductor die to the leads. The wires, the semiconductor die and then the most of the lead frame (except for the leads that extend outward) are then encapsulated in a molding material. The molding material is then shaped. The formed semiconductor die package includes a molded body that has leads extending laterally away from the molded body. The semiconductor die package can be mounted onto a circuit board.

While such semiconductor packages are useful, improvements could be made. For example, it would be desirable if the thickness of a semiconductor die package could be reduced. As consumer electronics (e.g., cell phones, laptop computers, etc.) continue to decrease in size, there is an ever increasing demand for thinner electronic devices and thinner electronic components. In addition, it would be desirable to improve the heat dissipation properties of a semiconductor die package. For example, power semiconductor devices such as vertical MOSFETs (metal oxide field effect transistors) can generate a significant amount of heat. For high output power applications (e.g., more than 60 Watts), special packaging is required to remove heat from the power transistor to prevent overheating. Overheating can also degrade the operational characteristics of a power transistor.

Embodiments of the invention address these and other problems individually and collectively.

SUMMARY OF THE INVENTION

Embodiments of the invention are directed towards semiconductor die packages.

One embodiment of the invention is directed to a semiconductor die package comprising: (a) a semiconductor die including a first surface and a second surface; (b) a source lead structure including protruding region having a major surface, the source lead structure being coupled to the first surface; (c) a gate lead structure being coupled to the first surface; and (d) a molding material around the source lead structure and the semiconductor die, wherein the molding material exposes the second surface of the semiconductor die and the major surface of the source lead structure.

Another embodiment of the invention is directed to a semiconductor die package comprising: a) a semiconductor die comprising an RF VDMOS transistor including a source region, a gate region, and a drain region; b) a source lead structure including a protruding portion having a major surface, and a plurality of leads extending laterally away from the protruding region, wherein the source lead structure is coupled to the source region of the semiconductor die; c) a gate lead structure coupled to the gate region of the semiconductor die; and d) a molding material covering at least a portion of the source lead structure, the gate lead structure and the semiconductor die, wherein the major surface is exposed through the molding material.

Another embodiment of the invention is directed to a method for forming a semiconductor die package, the method comprising: (a) attaching a semiconductor die including a first surface and a second surface, and solder on the first surface to a lead frame structure including a source lead structure having a protruding portion with a major surface, and a gate lead structure; and (b) molding a molding material around the semiconductor die and the source and the gate lead structures, wherein the second surface of the semiconductor die and the major surface of the source lead structure are exposed through the molding material.

These and other embodiments of the invention are described in further detail below.

DETAILED DESCRIPTION

The changing architecture of power supplies, for example, on a notebook computer motherboard necessitates having a drain of a MOSFET heatsunk (as the ground) and the source and the gate (in a semiconductor die) on a different plane instead of having all three terminals on the same plane. This shift by the notebook power supply designers has led to the need to create new and improved surface mount packages.

Embodiments of the invention are directed to new and improved semiconductor die packages. In embodiments of the invention, a solder bumped semiconductor die may be flipped over and may be mounted on a lead frame structure including a source lead structure and a gate lead structure. The source lead structure may have a large down-set portion and a partially-etched (e.g., half-etched) portion. A molding material can be molded around the source lead structure, and the semiconductor die so that a surface of the semiconductor die and a surface of the partially-etched portion of the source lead structure can be exposed through the molding material.

Embodiments of the invention have a number of advantages. First, the semiconductor die packages according to embodiments of the invention can have a low profile and two major surfaces for heat dissipation. For example, heat can be transferred away from a semiconductor die through a large source lead structure coupled to a first surface of a semiconductor die and also through a drain clip that is coupled to a second surface of the semiconductor die. The thermal resistance of this package is 35% lower than a standard SOIC (Small Outline Integrated Circuit) package and 10-15% lower than a FLMP package (Flipchip in a Leaded Molded Package). Exemplary SOIC and FLMP packages are described in U.S. Provisional Patent Application No. 60/349,260, filed Oct. 22, 2002. Second, embodiments of the invention can have a low profile. For example, in some embodiments of the invention, the thickness of the semiconductor die package can be from about 0.7 to about 1.0 mm. The profile of a package according to an embodiment of the invention is about 40-50% smaller than SOIC packages. This is thinner than most conventional semiconductor die packages. Because of its thin profile and its good thermal properties, a semiconductor die package according to an embodiment of the invention can be referred to as a low profile thermal enhanced flip chip in a leaded molded package (TFLMP).

The semiconductor dies used in the semiconductor die packages according to embodiments of the invention include vertical power transistors. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

Figure 1:
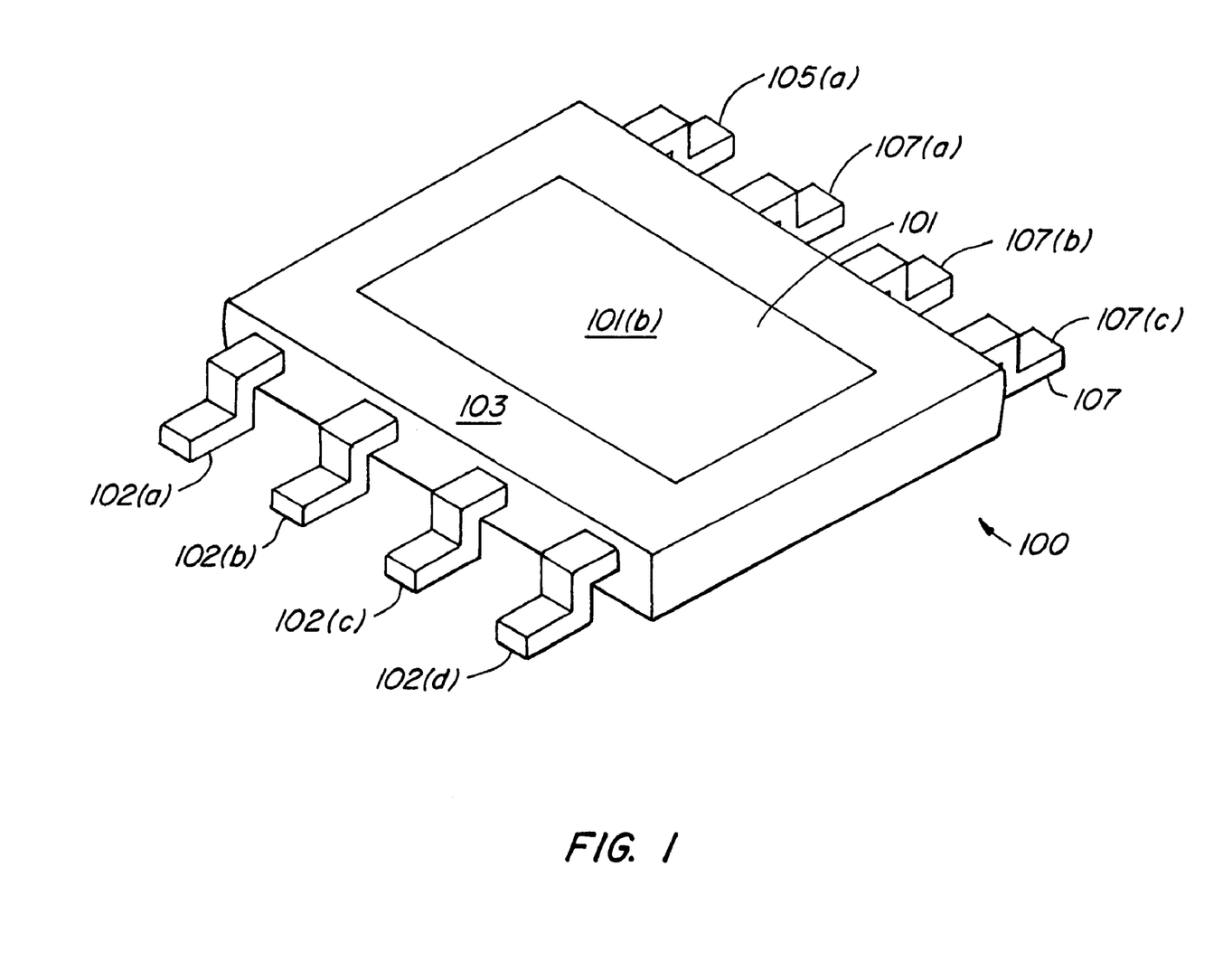
FIG. 1 shows a perspective view of an upper portion of a semiconductor die package according to an embodiment of the invention.

FIG. 1 shows a semiconductor die package 100 according to an embodiment of the invention. The semiconductor die package 100 includes a semiconductor die 101 with a major surface 101(b) that is exposed through a molding material 103. The entire major surface 101(b) or a substantial portion of the major surface 101(b) may be exposed through the molding material 103. As shown, the upper surface of the molding material 103 can be co-planar with the major surface 101(b) of the semiconductor die 101. The major surface 101(b) may correspond to the drain region of a MOSFET (metal oxide semiconductor field effect transistor), and may also correspond to the second surface of the semiconductor die 101. The other side of the semiconductor die can be the first side of the semiconductor die 101. Source and gate contact regions of the MOSFET can be at the first side of the semiconductor die.

The molding material 103 may comprise any suitable material. Suitable molding materials include biphenyl based materials, and multi-functional cross-linked epoxy resin composite materials.

In the semiconductor die package 100, a number of source leads 107(a)-107(c) extend laterally away from the molding material 103. The various source leads 107(a)-107(c) can be part of a source lead structure that is partially covered by the molding material 103. A gate lead 105(a) extends laterally away from the molding material 103.

A number of dummy leads 102(a)-102(d) can also extend laterally away from the molding material 103. In this example, the dummy leads 102(a)-102(d) provide structural support for the semiconductor die package 100 and are not electrically connected to the semiconductor die 101. In other embodiments, one or more of the dummy leads 102(a)-102(d) could be source leads so that functional leads are on both sides of the semiconductor die package.

Figure 2:
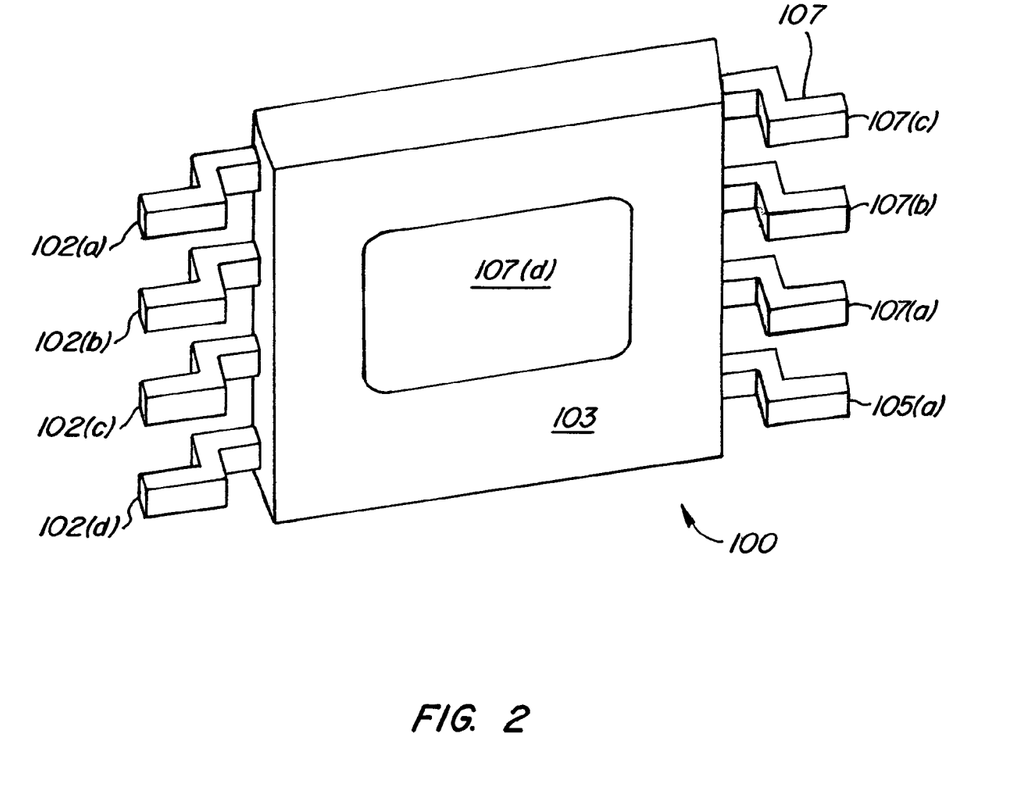
FIG. 2 shows a perspective view of a lower portion of a semiconductor die package according to an embodiment of the invention.

FIG. 2 shows a bottom view of a semiconductor die package 100 according to an embodiment of the invention. The semiconductor die package 100 includes a source lead structure 107 including a number of source leads 107(a)-107(c) that extend laterally away from a central region of the source lead structure 107. The central region is partially covered by the molding material 103. The central region includes a protruding region with a major surface 107(d), which is exposed through the bottom surface of the molding material 103. The major surface 107(d) can be coplanar with the bottom surface of the molding material 103.

Figure 3:
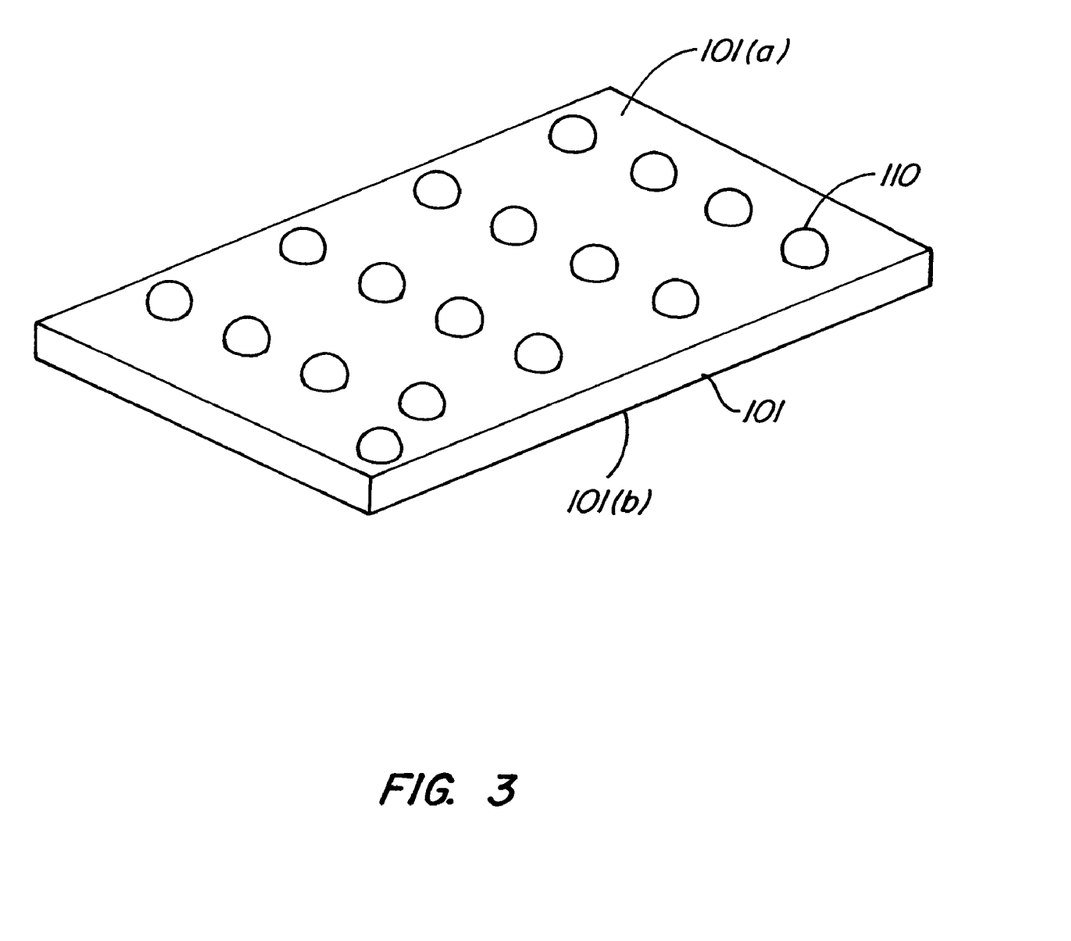
FIG. 3 shows a semiconductor die with an array of solder bumps.

FIG. 3 shows a semiconductor die 101 with an array of solder bumps 110 on the semiconductor die 101. One or more of the solder bumps 110 may constitute gate solder bumps and one or more of the solder bumps 110 may constitute source solder bumps. The semiconductor die 101 can include a vertical MOSFET with a source region and a gate region at a first surface 101(a), and a drain region at a second major surface 101(b). The solder bumps 110 may be on the first surface.

Figure 4:
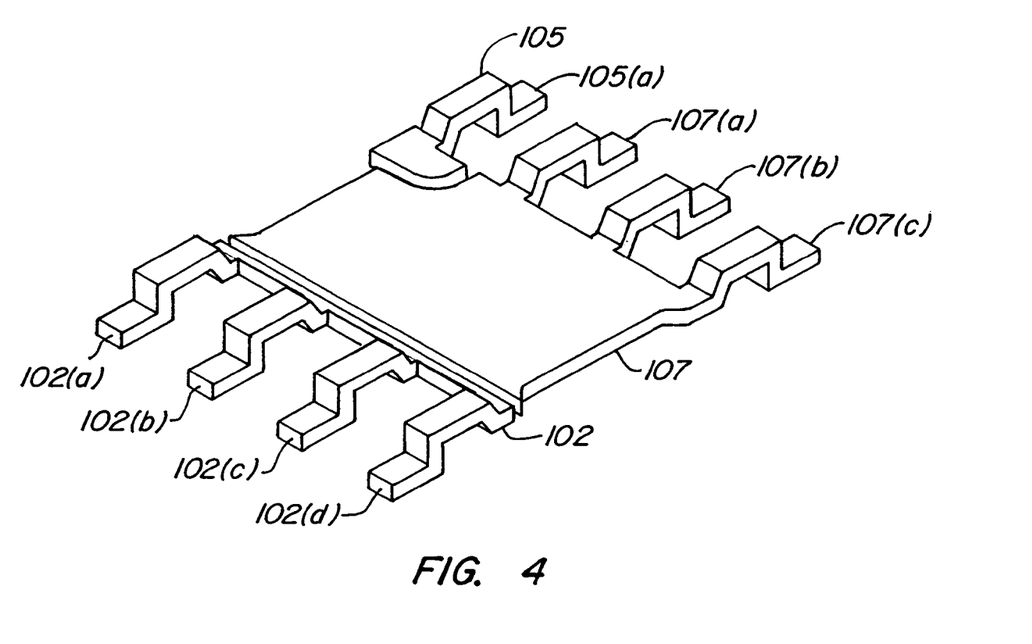
FIG. 4 shows a top perspective view of a lead frame structure including a gate lead structure and a source lead structure.

FIG. 4 shows a top perspective view of a lead frame structure including a source lead structure 107, a gate lead structure 105, and a dummy lead structure 102. The term "lead frame structure" can refer to a structure that is derived from a lead frame. Lead frames can be formed by, for example, a stamping process (known in the art). Lead frames can also be formed by etching a continuous conductive sheet to form a predetermined pattern. However, if stamping is used, the lead frame may originally be one of many lead frames in an array of lead frames that are connected together by tie-bars. During the process of making a semiconductor die package, the lead frame array may be cut to separate the lead frame from other lead frames. As a result of this cutting, portions of a lead frame structure in a final semiconductor die package such as a source lead and a gate lead may be electrically and mechanically uncoupled from each other. Thus, in embodiments of the invention, a lead frame structure in a semiconductor die package may be a continuous metallic structure or a discontinuous metallic structure.

The source lead structure 107 includes three source leads 107(a)-107(c). The gate lead structure 105 has one gate lead 105(a). The terminal portions of the source leads 107(a)-107(c) and the gate lead 105(a) can be co-planar and can be physically and electrically coupled to a circuit board (not shown) with solder. The dummy lead structure 102 has dummy leads 102(a)-102(d) that are not coupled to the source lead structure 107. However, the dummy leads 102(a)-102(d) could be coupled to the source lead structure in other embodiments.

Figure 5:
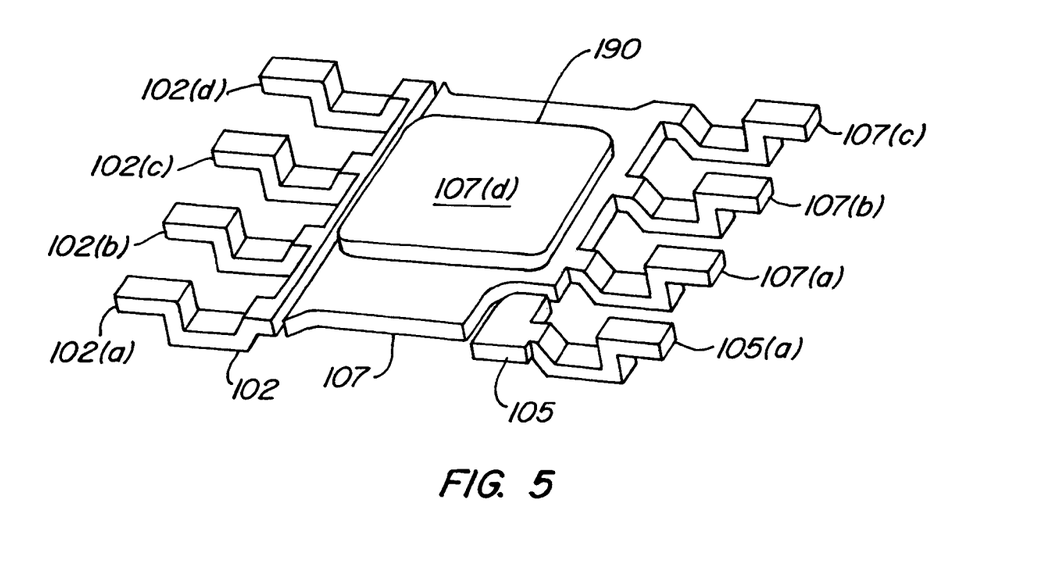
FIG. 5 shows a bottom perspective view of a lead frame structure including a gate lead structure and a source lead structure.

FIG. 5 shows a bottom view of the lead frame structure shown in FIG. 4. In FIG. 5, a protruding portion that extends from a central region of the source lead structure 107 is more clearly shown. The protruding portion 190 includes a major surface 107(d).

In the embodiment shown in FIG. 5, the protruding portion 190 can be formed by partially-etching (e.g., half-etching) a lead frame. The partially etched lead frame allows a molding material to flow during molding. The partially etched area provides enough area for a mold compound to flow and hold the assembled die package in tact and protected after molding. Partial etching can be performed using photolithography and etching processes that are known in the art. For example, a patterned photoresist layer may be formed on desired areas of a lead frame. The lead frame can then be etched (using, for example, wet or dry etching) to a predetermined depth, so that the lead frame is partially etched in some regions.

Figure 6:
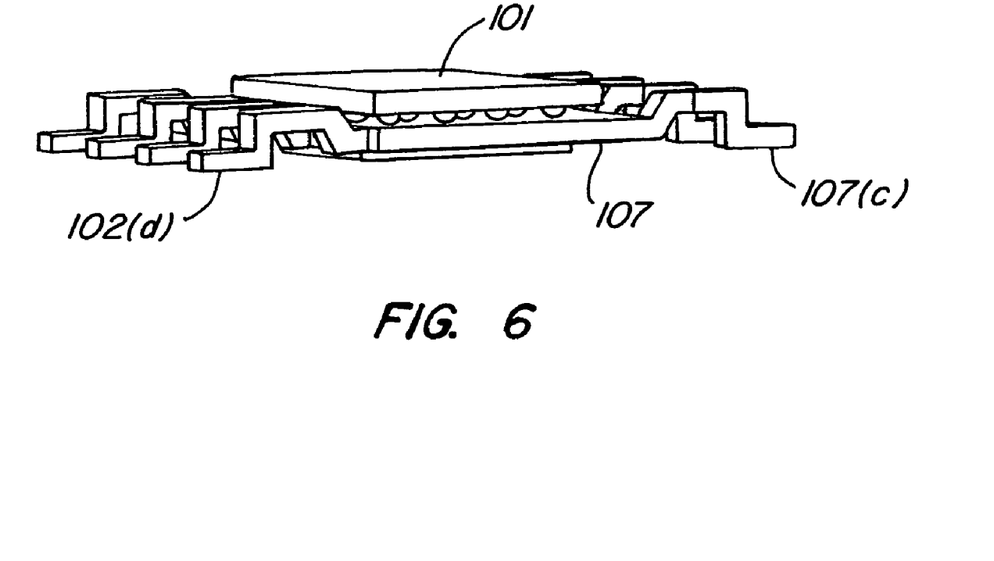
FIG. 6 shows a semiconductor die mounted on a lead frame structure including a gate lead structure and a source lead structure.
Figure 7:
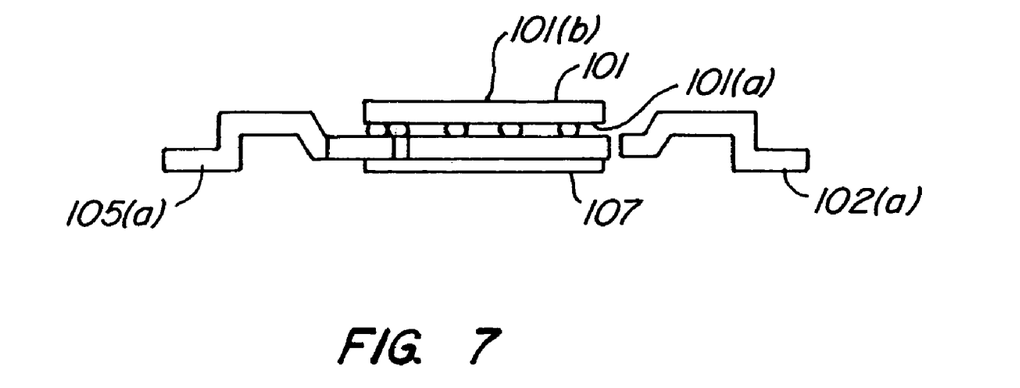
FIG. 7 shows a side view of a semiconductor die mounted on a lead frame structure.

FIGS. 6 and 7 show a semiconductor die 101 mounted on the source lead structure 107 with a source lead 107(c). As shown, the first surface 101(a) of the semiconductor die is proximate to the source lead structure 107, while the second, major surface 101(b) of the semiconductor die 101 is distal to it. A dummy lead 102(d) is also shown in FIG. 6. A gate lead 105(a) is shown in FIG. 7.

Figure 8A:
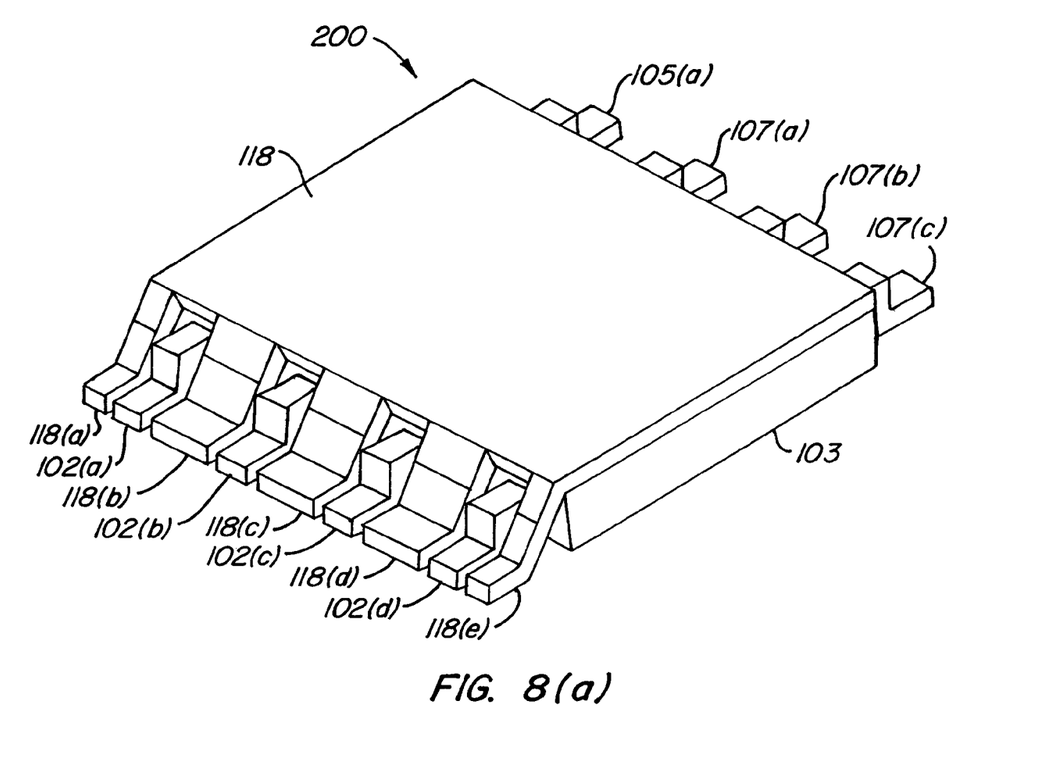
FIG. 8(a) shows a perspective view of a semiconductor die package including a drain clip.

FIG. 8(a) shows a semiconductor die package 200 according to another embodiment of the invention. The semiconductor die package 200 is similar to the previously described semiconductor die package 100, except that the semiconductor die package 200 shown in FIG. 8(a) includes a drain clip 118 including a plurality of drain leads 118(a)-118(d) that are interleaved between a plurality of dummy leads 102(a)-102(d). Both the drain leads 118(a)-118(d), and the dummy leads 102(a)-102(d) can all be mounted on a drain pad on a circuit board. Solder (not shown) can be used to attach the drain clip 118 to the backside of the semiconductor die.

Figure 8B:
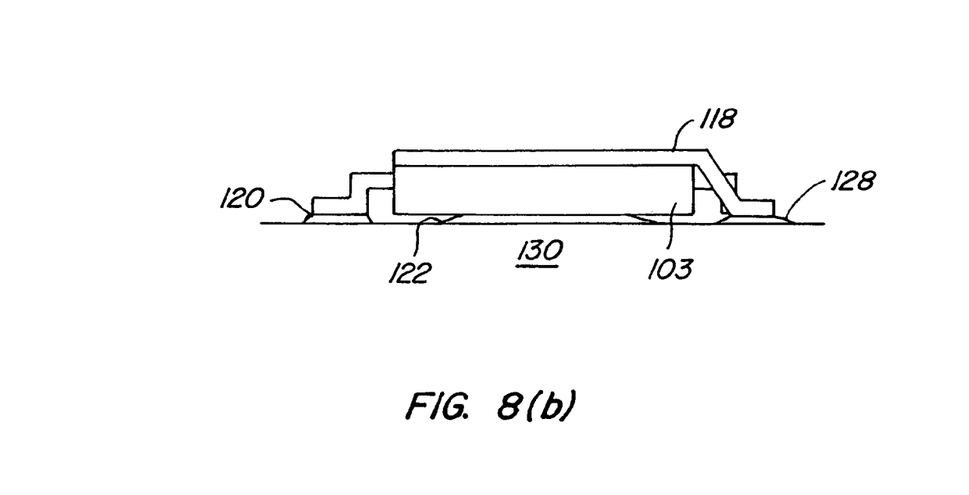
FIG. 8(b) shows a side view of a semiconductor die package including a drain clip.

FIG. 8(b) shows a side, cross-sectional view of the semiconductor die package 200 shown in FIG. 8(a). The semiconductor die package 200 is mounted on a circuit substrate 130. The circuit substrate 130 may be a printed circuit board. Solder deposits 120, 122, and 128 may respectively couple a source lead, the protruding portion of a source lead structure, and a drain lead to the circuit substrate 130.

Figure 9A:
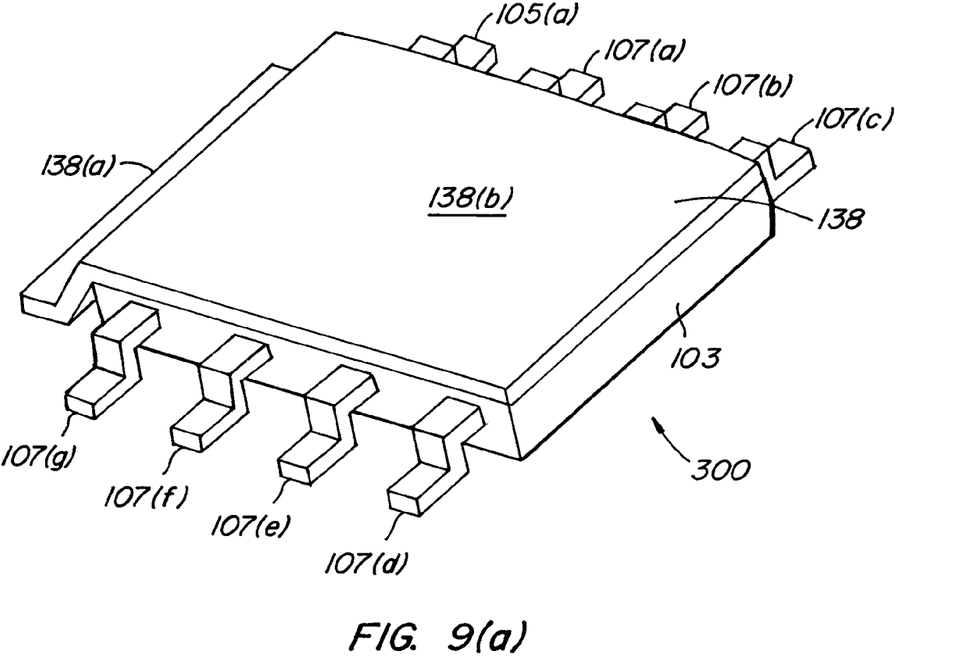
FIG. 9(a) shows a top view of a semiconductor die package including a drain clip.
Figure 9B:
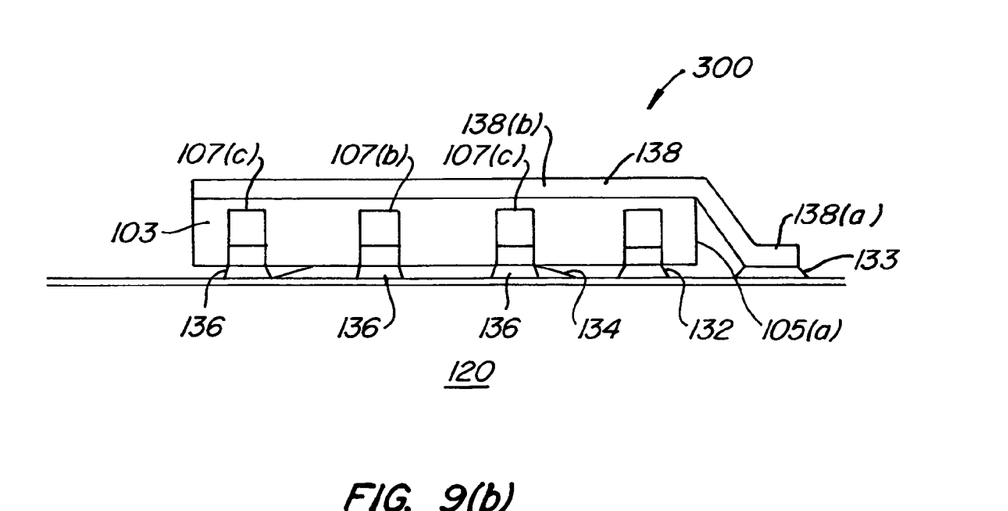
FIG. 9(b) shows a side view of a semiconductor die package including a drain clip.

FIGS. 9(a) and 9(b) show a semiconductor die package 300 according to yet another embodiment of the invention. In this embodiment, a drain clip 138 including a flat major portion 138(b) and an elongated portion 138(a) is electrically coupled to the backside of a semiconductor die. As shown in FIG. 9(b), the elongated portion 138(a) of the drain clip 138 would be attached to a circuit substrate 130 using solder 133. As shown in FIG. 9(a), the drain clip 138 is between the sets of source leads 107(a)-107(c) and 107(d)-107(g) at opposite sides of the semiconductor die package 300. Solder 134 can be used to attach the protruding portion of a source lead structure to the circuit substrate 130. Solder 136 may also be used to attach the source leads 107(a)-107(c) to the circuit substrate 130. Solder 132 can be used to couple the gate lead 105(a) to the circuit substrate 130. The solder bumps may be formed using any suitable process including plating, ball attach, stenciling, etc.

Embodiments of the invention may also be used in RF VDMOS (vertical diffused metal oxide semiconductor) packages. Such die packages can be used in RF power applications and can include power transistors. The power transistors can be used in high output power applications (e.g., in the range of 80 to 100 Watts, or more). In some embodiments of the invention, the semiconductor dies include transistors that can be used as active devices in an RF power amplifier. Such amplifiers may operate at frequencies in a range from below 1 MHz to 2 GHz and above.

Figure 10A:
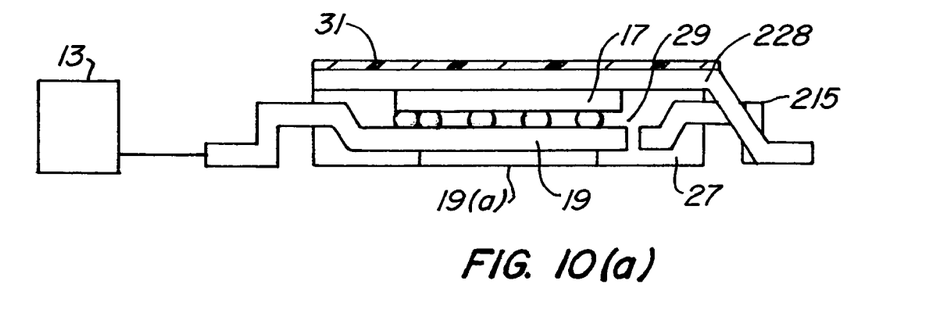
FIG. 10(a) shows a side cross-sectional view of a semiconductor die package.

FIG. 10(a) shows a side cross-sectional view of an exemplary embodiment. FIG. 10(a) shows an RF VDMOS semiconductor die 17 disposed between a drain clip 228 with drain leads and a source lead structure 19. Dummy leads 215 also extend laterally from the molding material 27 and are interspersed with the drain leads of the drain clip 228. A source lead structure 19 provides source current to a source region in a MOSFET in the semiconductor die 17.

Figure 10B:
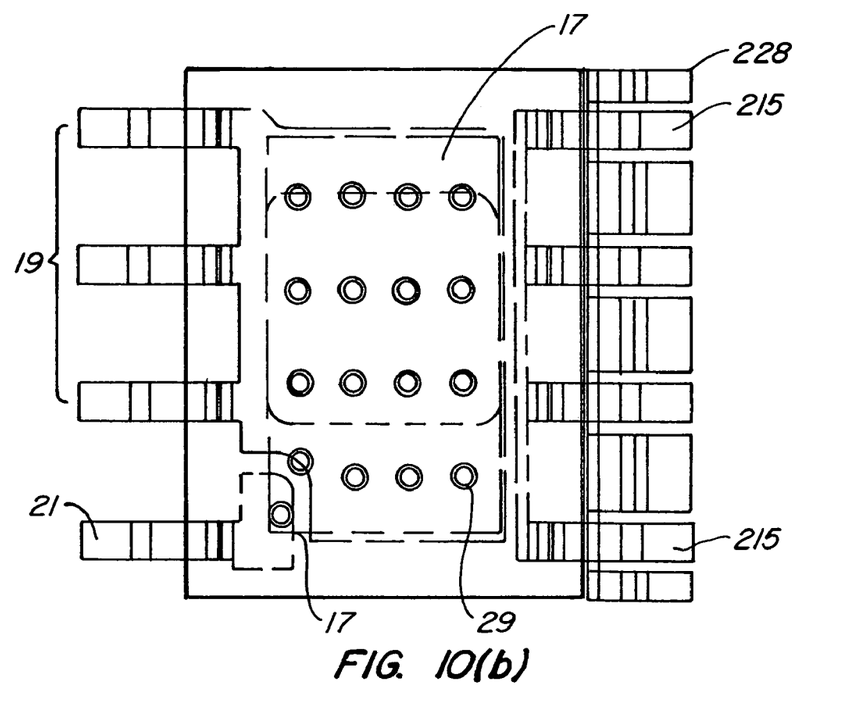
FIG. 10(b) shows a top view of a semiconductor die package with a block indicating a matching network that is electrically coupled to the semiconductor die package. Some components are shown by invisible lines.
Figure 11:
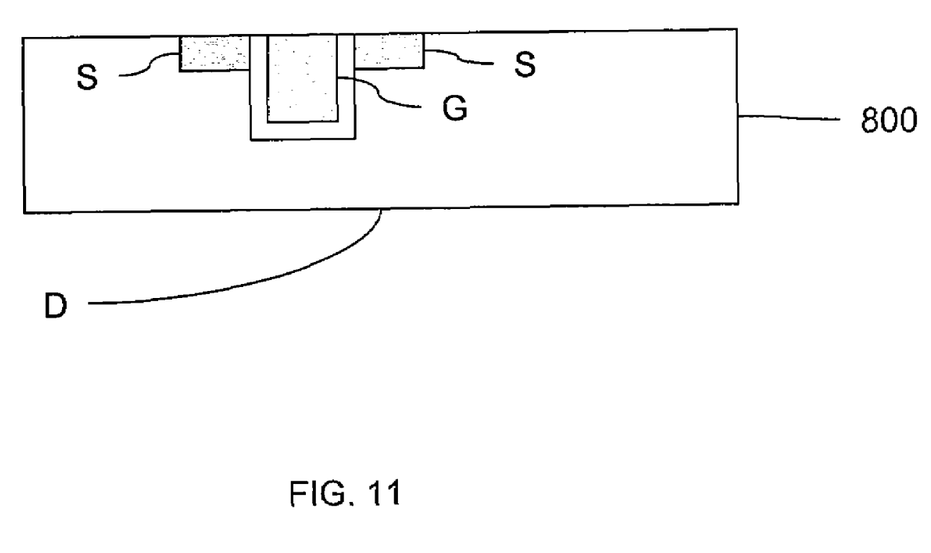
FIG. 11 shows a schematic diagram of a semiconductor die 800 including some components of a vertical MOSFET. The vertical MOSFET includes a gate G and source regions S at a first side of the die 800 and a drain region D at a second side of the die 800.

Referring to FIG. 10(b), a gate lead structure with a gate lead 21 provides gate current to a gate region in a MOSFET in the semiconductor die 17. Solder bumps 29 are also shown in FIG. 10(b).

Referring again to FIG. 10(a), a molding material 27 can encapsulate the semiconductor die 17. As in prior embodiments, a major surface 19(a) of a protruding portion of the source lead structure 19 may be exposed through the molding material 27.

A dielectric coating 31 can be on the drain clip 228. The dielectric coating 31 can be formed in any suitable manner using any suitable dielectric material. For example, the dielectric coating 31 can include a dielectric coating comprising, for example, polyimide or benzcyclobutane (BCB). Of course, a similar or different dielectric coating could be used in the same manner in any of the previously described or shown die package embodiments. The dielectric coating 31 can prevent shorts or potential electrocution during rework, without affecting the heat dissipation properties of the semiconductor die package.

As shown in FIG. 10(a), a matching network 13 is coupled to the source lead structure 19. In some embodiments, the matching network 13 may include semiconductor die capacitors (silicon MOS capacitors). These capacitors can be used to tune either or both of the input and/or output terminals of the power transistor. The MOS capacitors can be coupled to the transistor terminals using parallel small diameter wires so that the capacitance and inductance can be adjusted to specifically match the input and/or output signal of the power transistor to an amplifier circuit. Matching networks are well known in the art.

The semiconductor die packages according to embodiments of the invention can be made in any suitable manner. In some embodiments, the semiconductor die packages can be made using flip chip technology. First, a solder bump array may be formed on a semiconductor die as shown in FIG. 3. The solder bumps may be formed using any suitable process including plating, ball attach, stencil paste printing, pick and place process, etc. A reflow process can be performed after solder is deposited on the semiconductor die.

Second, before or after forming a semiconductor die with solder bumps, a lead frame structure with a large downset (the downset can depend on the thickness of the package) and a protruding region that is partially-etched is formed. The design of the lead frame structure can be such that the backside of the semiconductor die and the major surface of the source lead structure are exposed through the major exterior surfaces of the molding material in the semiconductor die package. Typical lead frame structures are shown in FIGS. 4 and 5. Processes for forming the lead frame structures shown in FIGS. 4 and 5 are described above.

Third, the bumped semiconductor die is flipped over and is mounted to the lead frame structure. A reflow process may be performed and the semiconductor die, the source lead structure, and the gate lead structure are then coupled together via solder. This is shown in FIGS. 6 and 7.

Fourth, the structures shown in FIGS. 6 and 7 can be placed within a mold cavity so that the molding material can be molded around portions of the semiconductor die, the source lead structure, and the gate lead structure. FIGS. 1 and 2 show the semiconductor die after a molding process is performed with a molding material.

In some embodiments, a tape assisted molding process can be used to mold the molding the molding material around the semiconductor die, the gate lead structure, and the source lead structure. For example, a tape can be placed against the backside of the semiconductor die in the package precursor shown in FIG. 6. Then, the combination can be placed in a molding cavity where a molding material is introduced. The molding material does not is molded around the semiconductor die, the gate lead structure, and the source lead structure. Excess molding material is removed from the major surface of the protruding portion of the source lead structure. Dejunk and deflash processes (known in the art) can be used to remove excess molding material. The tape can be removed from the backside of the semiconductor die to thereby expose the backside of the die through the molded molding material.

Then, if desired, a drain clip can be attached to the backside of the semiconductor die. A drain clip such as the one shown in FIGS. 8(a)-8(b) could be attached to the semiconductor die. Alternatively, a drain clip such as the one shown in FIGS. 9(a)-9(b) could be attached to the semiconductor die. The drain clip can serve as a heat sink. Alternatively or additionally, a separate heat sink could be attached to the drain clip to facilitate further heat dissipation.

After a drain clip is attached to the backside of the semiconductor die, the resulting semiconductor die package may be mounted on a circuit substrate such as a printed circuit board (PCB). The drain clip can be connected to the drain region in the semiconductor die. The drain clip can be extended to connect to the heat sink of the PCB. These general assemblies are shown in FIGS. 8(b) and 9(b).

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, one or more features of any embodiment may be combined with one or more features of any other specifically described embodiment without departing from the scope of the invention.

What is claimed is:

1. A semiconductor die package comprising:
    a leadframe including a central region including a protruding region having a major surface;
    a semiconductor die including a first surface and a second surface; and
    a molding material around at least a portion of the leadframe and around lateral edges of the protruding region, wherein the major surface of the protruding region is not covered with the molding material, and wherein the protruding region is directly under the semiconductor die.

2. The semiconductor die package of claim 1 wherein the semiconductor die includes a source region and a gate region at the first surface, and a drain region at the second surface.

3. The semiconductor die package of claim 1
    further comprising solder coupling the semiconductor die and the leadframe.

4. The semiconductor die package of claim 1 wherein the leadframe includes a source lead structure and a gate lead structure.

5. The semiconductor die package of claim 1 wherein the semiconductor die comprises a vertical power MOSFET.

6. The semiconductor die package of claim 1 wherein the protruding region is formed using a half etching process.

7. A semiconductor die package comprising:
    a leadframe including a protruding region having a major surface;
    a semiconductor die including a first surface and a second surface; and
    a molding material around at least a portion of the leadframe and around the protruding region, wherein the major surface of the protruding region is exposed through the molding material,
    wherein the semiconductor die comprises a trenched gate.

8. The semiconductor die package of claim 1 wherein the leadframe has leads which extend laterally from the molding material of the semiconductor die package.

9. The semiconductor die package of claim 1 further comprising solder coupling the semiconductor die and the leadframe, and wherein the semiconductor die comprises a vertical power MOSFET.

10. The semiconductor die package of claim 1 wherein the semiconductor die includes a source region and a gate region, and wherein the semiconductor die package includes solder on the source region and the gate region.

11. The semiconductor die package of claim 1 wherein an exterior surface of the molding material is substantially co-planar with the major surface of the protruding region.

12. The semiconductor die package of claim 1 wherein the molding material is also formed around the die.

13. The semiconductor die package of claim 1 wherein a first exterior surface of the molding material is substantially coplanar with the second surface of the semiconductor die and wherein a second exterior surface of the molding material is substantially coplanar with the major surface.

* * * * *